United States Patent [19]

Bergmann et al.

[11] Patent Number: 4,954,868
[45] Date of Patent: Sep. 4, 1990

[54] MOS SEMICONDUCTOR DEVICE WHICH HAS HIGH BLOCKING VOLTAGE

[75] Inventors: Rainer Bergmann, Rohrbach; Josef-Matthias Gantioler, Munich, both of Fed. Rep. of Germany

[73] Assignee: Siemens Aktiengesellschaft, Berlin and Munich, Fed. Rep. of Germany

[21] Appl. No.: 341,044

[22] Filed: Apr. 20, 1989

[30] Foreign Application Priority Data

May 11, 1988 [DE] Fed. Rep. of Germany ....... 3816257

[51] Int. Cl.[5] ...................... H01L 29/40; H01L 29/78
[52] U.S. Cl. ..................................... 357/53; 357/23.4; 357/23.8
[58] Field of Search ................... 357/23.3, 23.4, 23.11, 357/23.13, 23.8, 53

[56] References Cited

U.S. PATENT DOCUMENTS

| | | | |
|---|---|---|---|
| 3,767,981 | 10/1973 | Polata | 317/235 R |
| 3,906,542 | 9/1975 | Krambeck et al. | 357/24 |
| 3,961,358 | 6/1976 | Polinsky | 357/53 |
| 4,499,653 | 2/1985 | Kub et al. | 29/571 |
| 4,553,125 | 11/1985 | Sugawara | 338/283 |
| 4,614,959 | 9/1986 | Nakagawa | 357/23.8 |
| 4,651,182 | 3/1987 | Yamazaki | 357/23.4 |
| 4,706,107 | 11/1987 | Terada et al. | 357/23.5 |

FOREIGN PATENT DOCUMENTS

| | | |
|---|---|---|
| 0069429 | 1/1983 | European Pat. Off. . |
| 0077481 | 4/1983 | European Pat. Off. . |
| 3516222 | 11/1986 | Fed. Rep. of Germany . |

OTHER PUBLICATIONS

Claessen et al., 'An Accurate DC Model for High Voltage Lateral DMOS Transistors Suited for CACD', IEEE Trans on ED, vol. ED-33, Dec. 86.
Neilson et al, 'Tapered Field', RCA Tech Notes, 5-83.

Primary Examiner—William D. Larkins
Assistant Examiner—Stephen D. Meier
Attorney, Agent, or Firm—Hill, Van Santen, Steadman & Simpson

[57] ABSTRACT

A semiconductor component which comprises a planar structure which has a channel stopper 7 formed at one edge and a field electrode which covers a pn-junction 3 of the planar zones adjoining the edge 4. The blocking voltage can be increased by providing a channel stopper field plate 19 arranged over the channel stopper and an anode field plate 18 arranged over the field electrode and these field plates are spaced a greater distance from the surface 8 of the semiconductor body between the electrodes 18 and 19 and they have over the channel stopper electrode and the gate electrode.

5 Claims, 2 Drawing Sheets

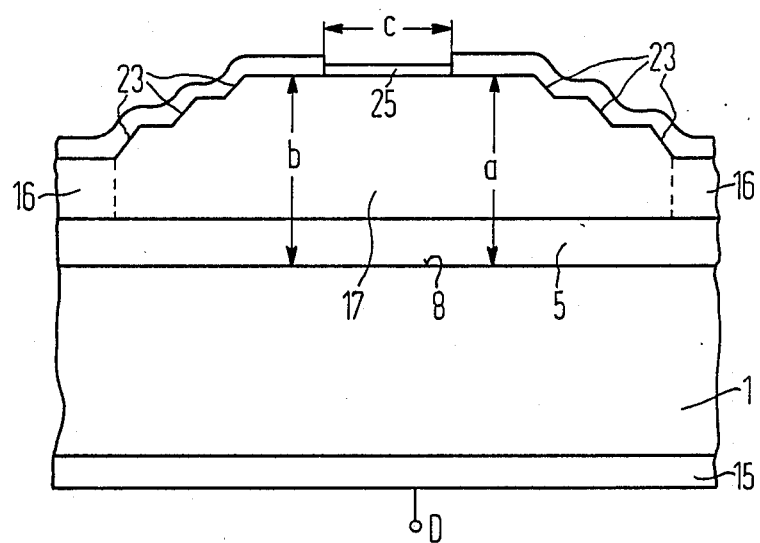

MOS SEMICONDUCTOR DEVICE WHICH HAS HIGH BLOCKING VOLTAGE

BACKGROUND OF THE INVENTION

1. Field of the Invention

This invention relates in general to a semiconductor component which has at least one planar zone embedded in a surface of a semiconductor body and a first insulating layer on the surface of the semiconductor body and a channel stopper electrode formed on the first insulating layer at the edge of the semiconductor body 3 and an electrode that covers the pn-junction adjoining the planar zone formed on the first insulating layer. The electrode and channel stopper electrode are covered by a second insulating layer and a channel stopper field plate is formed on the second insulating layer which covers the channel stopper electrode at least on that portion facing away from the edge of the semiconductor body and is electrically connected to the channel stopper electrode. An anode field plate is formed on the second insulating layer and covers the electrode at least at that side facing away from the planar zone and is electrically connected to the planar zone and the two field plates are spaced apart and the second insulating layer is thicker in the region between the channel stopper field plate and the anode field plate.

2. Description of Related Art

FIG. 1 illustrates a prior art semiconductor component which has a semiconductor body 1 which has a top planar surface 8 in which a zone 2 is formed that has a conductivity type that is opposite to the semiconductor body 1. The semiconductor body 1 is limited by an edge 4 as shown. A first insulating layer 5 is arranged on the surface 8 and extends up to the edge 4 and covers the pn-junction 3 where it abuts the surface 8 on the side opposite the edge 4. A channel stopper field electrode 7 is formed on the first insulating layer starting adjacent the edge 4 of the semiconductor body and extends at its other edge over the pn-junction 3 between zone 2 and semiconductor body 1. An electrode 6 covers the first insulating layer 5 above the pn-junction 3. In the case of a MOS transistor, for example, the electrode 6 can be a gate electrode and can be connected to a gate terminal G.

A second insulating layer 9 is formed over the channel stopper electrode 7, the first insulation layer 5 and the electrode 6 as shown. A channel stopper field plate 11 which is electrically connected to the channel stopper electrode 7 is provided on the second insulating layer 9 adjacent the edge 4. An anode field plate 10 which overlaps the electrode 6 is formed on the second insulating layer 9 on the side which faces away from the edge 4. The inner edges of the field plates 10 and 11 are spaced from each other as shown. The surface of the second insulating layer 9 between the edges of field plates 10 and 11 is covered with a passivation layer 12. The passivation layer is formed of a poorly conductive material, for example, amorphous silicon. The amorphous silicon has a defined specific resistance so that a defined voltage curve can be maintained between the field plate 10 and the field plate 11. The field lines thus emerge from the opening between the field plates 10 and 11 and are uniformly distributed. With the thickness of the two insulating layers 5 and 9 which is relatively small, a relatively high blocking or offstate voltage for the semiconductor component can be obtained. A highly doped anode zone 15 is provided on the other side of the semiconductor body 1.

The specific resistance and the stability of the amorphous silicon are very difficult to reproduce and require extreme care during manufacturing processes.

Patents which are related to this invention are U.S. Pat. Nos. 3,767,981, 4,614,959, European Patent Application 069,429, German DE No. 351,622, German DE No. 3,141,203, German DE No. 3,046,749, European Patent No. 077,481 and the publication in IEEE Transactions on Electron Devices ED-33, 1986, December, No. 12, New York, N.Y. U.S.A. entitled "An Accurate DC Model For High Voltage Lateral DMOS Transistors Suited for CACD" Pages 1964–1970.

SUMMARY OF THE INVENTION

It is an object of the present invention to improve a semiconductor component of the prior art such as described above which can be suitable for high blocking or offstate voltages even when different insulating passivation layers are utilized. The edge region and the distance from the edge 4 to the closest planar zone 2 adjacent to the edge can be as small as possible.

The objective of the invention is achieved by utilizing the following features:

(1) The second insulating layer has a region which is thicker between the electrode and the channel stopper electrode than it is over the electrodes;

(2) The end of the anode field plate which faces toward the edge of the semiconductor body and the end of the channel stopper field plate which faces away from the edge of the semiconductor body are formed on the region of greater thickness of the second insulating layer.

It is a feature of the present invention that the thicker region of the second insulating layer has edges which arise substantially at right angles to the surface of the substrate. A modification of the invention provides that the region of greater thickness of the second insulating layer rises in steps.

It is another feature of the present invention that the ends of the field plates adjacent each other over the second insulating layer have the same spacing from the surface 8 of the semiconductor body.

Another feature of the invention that the region between the field plates 6 and 7 is covered with a passivation layer 25 and such layer may be an insulating passivation layer.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 3 is a sectional view illustrating a modification of the invention.

DESCRIPTION OF THE PREFERRED EMBODIMENTS

Figure 1:
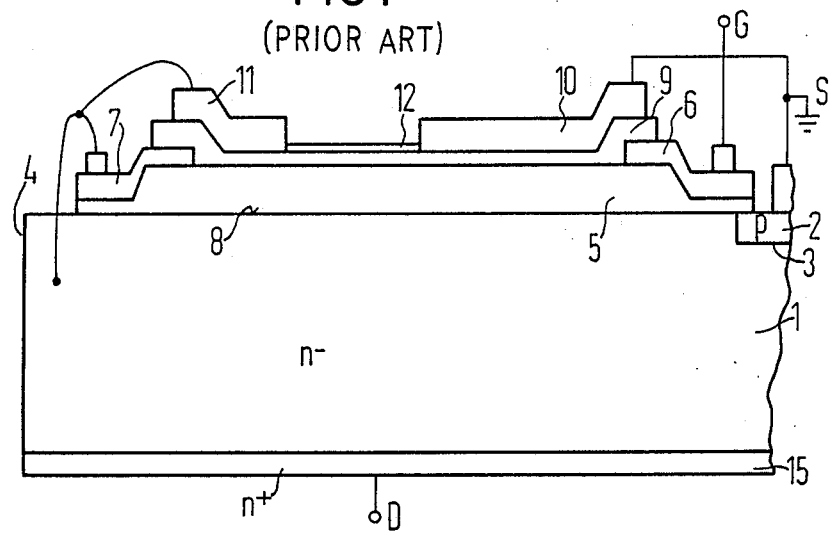
FIG. 1 is a sectional view of a prior art device.
Figure 2:
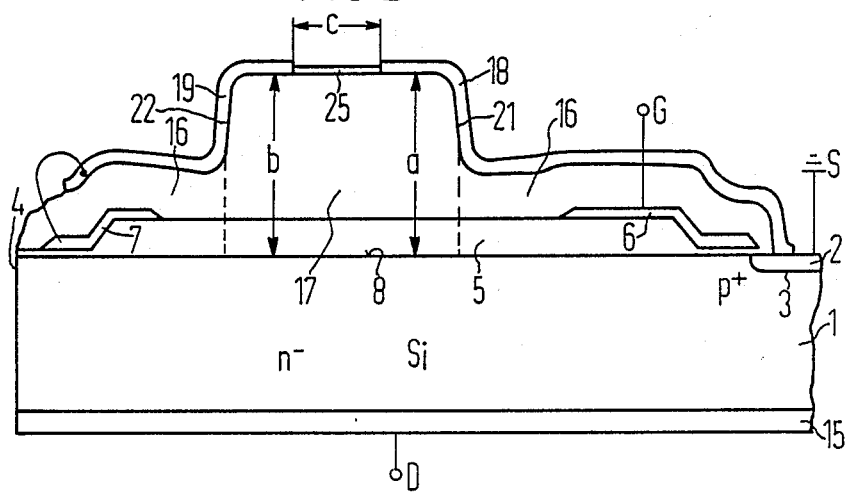
FIG. 2 is a sectional view illustrating the invention.

FIG. 2 illustrates the invention wherein a semiconductor body has an upper surface 8 in which a zone 2 of a conductivity type opposite that of the semiconductor body 1 is planarly embedded. The semiconductor body 1 has an edge 4 which is spaced from the zone 2. A first insulating layer 5 is mounted on the surface 8 and extends to the edge 4 and covers the pn-junction 3 where it abuts the surface 8. A channel stopper field electrode 7 is formed on the first insulating layer at the edge 4 of the semiconductor body as shown. An electrode 6 which might be a gate electrode, for example, covers the insulating layer 5 adjacent the zone 2 as shown. The gate terminal G is connected to electrode 6. A second insulating layer 16 is formed over the first insulating layer 5 and the electrodes 6 and 7 and the second insulating layer 16 has a region 17 between the electrode 6 and the channel stopper electrode 7 which has a substantially greater thickness than the second insulating layer has over the electrodes 6 and 7. The total thickness of the insulating layers 5 and 16 in the region 17 which is thicker may be a few micrometers in the region between the two vertical-dash lines shown in FIG. 2. The overall thickness of 8 micrometers results in a blocking or offstate voltage of, for example, 1250 volts. An anode field plate 18 is formed over the second insulating layer 16 and extends partially over the thicker region 17. It also covers the electrode 6 and is electrically connected to the planar zone 2. It is critical that the field plate 18 overlap the electrode 6 at least on its side which faces toward the edge 4. The channel stopper electrode 7 is covered by a channel stopper field plate 19 which is formed over the second insulating layer 16 and also has a portion which extends partially over the region 17 of greater thickness. It is critical that the field plate 19 overlap the channel stopper electrode 7 at least at its side which faces toward the planar zone 2.

The field plates 18 and 19 have a defined spacing c from each other on the top of region 17 as shown. In the spacing c between the field plates 18 and 19, the second layer 16 is covered with a passivation layer 25. The passivation layer 25 can be an insulating layer formed, for example, of silicon nitride SI$_3$N$_4$. The spacing c is selected so that the electrical field strength between the field plates 18 and 19 is so high that the charges accumulating at the passivation layer can no longer have any influence on the field distribution between the field plates. In a specific exemplary embodiment, a spacing of c of about 35 micrometers has proven to be satisfactory.

FIG. 3 illustrates a modification of the invention wherein the edges of the second insulating layer are not substantially vertical as shown by the edges 21 and 22 in FIG. 2, but are made in a substantially step-wise manner as shown in FIG. 3 wherein the edges are formed as steps 23 as shown. The slanting edges 23 can be formed by appropriately structuring the oxide used as an insulating layer. For this purpose, for example, an oxide layer can be deposited which has a thickness over the entire semiconductor component corresponding to the thickness in the region 17. Phosphorous ions for example, can then be implanted into the surface of the oxide layer and these phosphorous ions destroy a surface approximate region of the oxide layer. The region 17 can then be masked and the non-masked region is etched so as to remove a portion of the thickness of the layer. Due to the superficial destruction of the oxide layer, the mask is laterally undercut whereby the etching continuous vertically at the same time. A slanting edge 23 as shown can, thus, be obtained to produce the embodiment illustrated in FIG. 3.

Since it is generally difficult to manufacture the region 17 having greater thickness by, for example, deposition of an oxide in a single process step having, for example, a thickness of 8 micrometers, it is recommended that the second insulating layer be produced by successive deposition of a plurality of thinner layers of insulation.

A particular advantage of the arrangement is that the edge region between the edge 4 and the planar zone 2 can be kept extremely narrow. A width of 250 micrometers has proven adequate in semiconductor components to obtain a blocking voltage of 1200 volts.

The manufacture of the semiconductor component is especially beneficial when the field plates 18 and 19 have the same vertical distance from the surface 8 on the region 17 and where a=b.

Although the invention has been described with respect to preferred embodiments, it is not to be so limited as changes and modifications can be made which are within the full intended scope of the invention as defined by the appended claims.

We claim as our invention:

1. A semiconductor component which has a semiconductor body comprising:
   (a) at least one planar zone (2) embedded in a surface (8) of the semiconductor body, said one planar zone forming a pn-junction with the adjacent portion of the semiconductor body;
   (b) a first insulating layer (5) on the surface (8) of the semiconductor body;
   (c) a channel stopper electrode (7) formed on the first insulating layer (5) at the edge (4) of the semiconductor body;
   (d) an electrode (6) formed over the pn-junction (3) adjoining the planar zone (2) and formed on the first insulating layer;
   (e) said electrode (6) and said channel stopper electrode (7) covered by a second insulating layer (16);
   (f) a channel stopper field plate (19) formed on the second insulating layer (16) and said channel stopper field plate covering the channel stopper electrode (7) at least at that side facing away from the edge (4) of the semiconductor body and electrically connected to the channel stopper electrode;
   (g) an anode field plate (18) formed on the second insulating layer (16) and said anode field plate covering the electrode (6) at least at that side facing away from the planar zone (2) and electrically connected to the planar zone (2);
   (h) a space (c) between said channel stopper field plate (19) and said anode field plate (18),
   (i) said second insulating layer (16) has a region (17) between said electrode (6) and said channel stopper electrode (7) which is thicker than the region over said electrodes;
   (k) the end of the anode field plate facing toward the edge of the semiconductor body and the end of the channel stopper field plate facing away from the edge of the semiconductor body lie on said region (17) of greater thickness, and wherein the region (17) of greater thickness is covered with an insulating passivation layer (25) between the field plates (6, 7).

2. A semiconductor component according to claim 1 wherein the region (17) of greater thickness has edges (21, 22) which rises substantially at right angles to the surface (8).

3. A semiconductor component according to claim 1, wherein the region of greater thickness has edges (23) which rise in steps.

4. A semiconductor component according to claim 1 or 2 or 3 wherein the ends of the field plates facing toward each other have the same spacings (a, b) from the surface (8) of the semiconductor body.

5. A semiconductor component which has a semiconductor body comprising:
 (a) at least one planar zone (2) embedded in a surface (8) of the semiconductor body, said one planar zone forming a pn-junction with the adjacent portion of the semiconductor body;
 (b) a first insulating layer (5) on the surface (8) of the semiconductor body;
 (c) a channel stopper electrode (7) formed on the first insulating layer (5) at the edge (4) of the semiconductor body;
 (d) an electrode (6) formed over the pn-junction (3) adjoining the planar zone (2) and formed on the first insulating layer;
 (e) said electrode (6) and said channel stopper electrode (7) covered by a second insulating layer (16);
 (f) a channel stopper field plate (19) formed on the second insulating layer (16) and said channel stopper field plate covering the channel stopper electrode (7) at least at that side facing away from the edge (4) of the semiconductor body and electrically connected to the channel stopper electrode;
 (g) an anode field plate (18) formed on the second insulating layer (16) and said anode field plate covering the electrode (6) at least at that side facing away from the planar zone (2) and electrically connected to the planar zone (2);
 (h) a space (c) between said channel stopper field plate (19) and said anode field plate (18),
 (i) said second insulating layer (16) has a region (17) between said electrode (6) and said channel stopper electrode (7) which is thicker than the region over said electrodes;
 (k) the end of the anode field plate facing toward the edge of the semiconductor body and the end of the channel stopper field plate facing away from the edge of the semiconductor body lie on said region (17) of greater thickness, and wherein the region (17) of greater thickness is covered with an insulating passivation layer (25) between the field plates (6, 7), and the spacing (c) between the field plates (18 and 19) is selected such that the electrical field strength is so high that charges accumulating at the passivation layer (25) do not influence the field distribution between the field plates.

* * * * *